United States Patent
Jeong et al.

(10) Patent No.: US 7,521,319 B2
(45) Date of Patent: Apr. 21, 2009

(54) METHOD OF FORMING GATE OF FLASH MEMORY DEVICE

(75) Inventors: Cheol Mo Jeong, Kyeongki-do (KR); Whee Won Cho, Chungcheongbuk-do (KR); Jung Geun Kim, Seoul (KR); Seong Hwan Myung, Kyeongki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 135 days.

(21) Appl. No.: 11/646,777

(22) Filed: Dec. 28, 2006

(65) Prior Publication Data

US 2008/0003754 A1     Jan. 3, 2008

(30) Foreign Application Priority Data

Jun. 28, 2006   (KR) .................. 10-2006-0058779

(51) Int. Cl.
  *H01L 21/336* (2006.01)
(52) U.S. Cl. ...................... 438/257; 438/266
(58) Field of Classification Search ........... None
  See application file for complete search history.

(56) References Cited

U.S. PATENT DOCUMENTS

| | | | | |
|---|---|---|---|---|
| 6,873,019 | B2 * | 3/2005 | Ida et al. | 257/382 |
| 6,884,680 | B2 * | 4/2005 | Koh | 438/257 |
| 7,037,784 | B1 * | 5/2006 | Hong | 438/257 |
| 7,052,972 | B2 * | 5/2006 | Sandhu et al. | 438/445 |
| 7,262,093 | B2 * | 8/2007 | Wang | 438/257 |

FOREIGN PATENT DOCUMENTS

| | | |
|---|---|---|
| KR | 10-2002-0056141 | 7/2002 |
| KR | 10-2003-057879 | 7/2003 |
| KR | 10-2004-0098106 | 11/2004 |

* cited by examiner

*Primary Examiner*—N Drew Richards
*Assistant Examiner*—Khanh B Duong
(74) *Attorney, Agent, or Firm*—Marshall, Gerstein & Borun LLP

(57) ABSTRACT

A method of forming a gate of a flash memory device, including the steps of forming a gate on a semiconductor substrate and forming an oxide layer on the entire surface of the gate, forming a nitride layer on a sidewall of the oxide layer in a spacer form, performing a polishing process so that a top surface of the gate is exposed, and then stripping the nitride layer to form an opening, forming a barrier metal layer on a sidewall of the opening, and forming a tungsten layer in the opening.

12 Claims, 6 Drawing Sheets

CELL REGION | SELECTION LINE REGION

CELL REGION | SELECTION LINE REGION

CELL REGION | SELECTION LINE REGION

CELL REGION | SELECTION LINE REGION

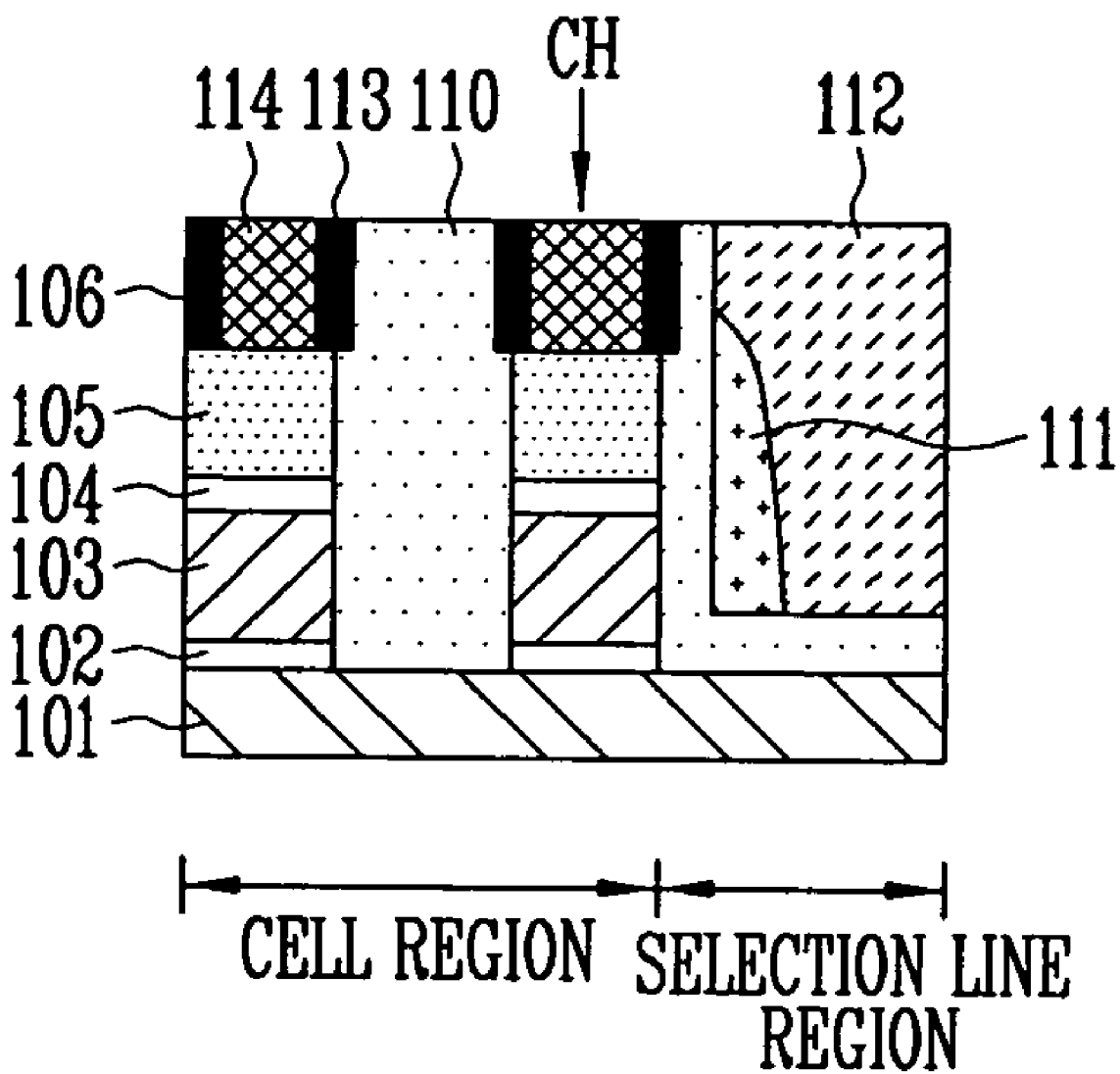

METHOD OF FORMING GATE OF FLASH MEMORY DEVICE

BACKGROUND

1. Field of the Invention

The invention relates, in general, to flash memory devices and, more particularly, to a method of forming a gate of a flash memory device.

2. Discussion of Related Art

As the level of integration of flash memory devices increases, a metal line formation method using the damascene method instead of the conventional Reactive Ion Etching (RIE) method is increasingly used. This is because in memory devices of 60 nm or less, a tungsten gate has a narrow width of 60 nm or less and is difficult to pattern using the conventional RIE method. In the case where a tungsten silicide (WSi) gate is used, it is difficult to secure a gate line. In the case where a target is increased so as to secure resistance, it results in increased intra-capacitance. Furthermore, a hard mask layer, a tungsten silicide layer, a polysilicon layer, and an oxide layer must be etched at the same time even at the time of gate etch. In the case where a tungsten gate is formed using the RIE method, it is difficult to form a spacer because of tungsten oxidization and the reliability of the gate is low due to thermal budget. In addition, in the case where the conventional tungsten (W) single damascene method is used, a first polysilicon layer pattern must be formed at the ISO level and the coupling ratio is decreased due to misalignment.

SUMMARY OF THE INVENTION

Accordingly, the invention provides a method of forming a gate of a flash memory device, wherein gate pattern margin can be increased and capacitance between gates can be decreased.

According to one aspect, the invention provides a method of forming a gate of a flash memory device, including the steps of forming a gate on a semiconductor substrate and forming an oxide layer on the entire surface of the gate, forming a nitride layer on a sidewall of the oxide layer in a spacer form, performing a polishing process so that a top surface of the gate is exposed, and then stripping the nitride layer to form an opening, forming a barrier metal layer on a sidewall of the opening, and forming a tungsten layer in the opening.

BRIEF DESCRIPTION OF THE DRAWINGS

FIGS. 1 to 11 are cross-sectional views illustrating a method of forming a gate of a flash memory device according to an embodiment of the invention.

DETAILED DESCRIPTION OF EMBODIMENTS

Specific embodiments according to the invention are described below with reference to the accompanying drawings.

FIGS. 1 to 11 are cross-sectional views illustrating a method of forming a gate of a flash memory device according to an embodiment of the invention.

Figure 1:
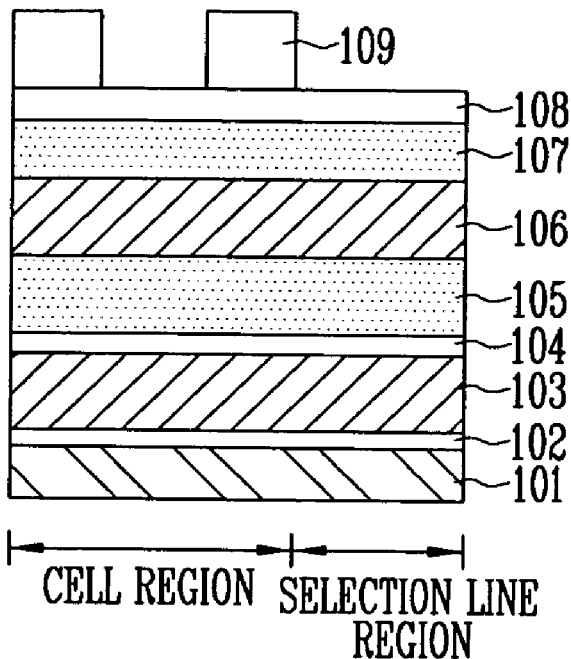

Referring to FIG. 1, a tunnel oxide layer 102, a first polysilicon layer 103 for a floating gate, a dielectric layer 104, a second polysilicon layer 105 for a control gate, a first nitride layer 106, a hard mask layer 107, a SiON layer 108, and a photoresist 109 are sequentially laminated on a semiconductor substrate 101 in which a cell region and a selection line region are defined. The photoresist 109 is patterned. The first nitride layer 106 is preferably formed to a thickness of 500 Å to 2000 Å. The hard mask layer 107 is preferably formed using α-carbon to a thickness of 500 Å to 2000 Å. The SiON layer 108 is preferably formed to a thickness of 100 Å to 1000 Å.

Figure 2:
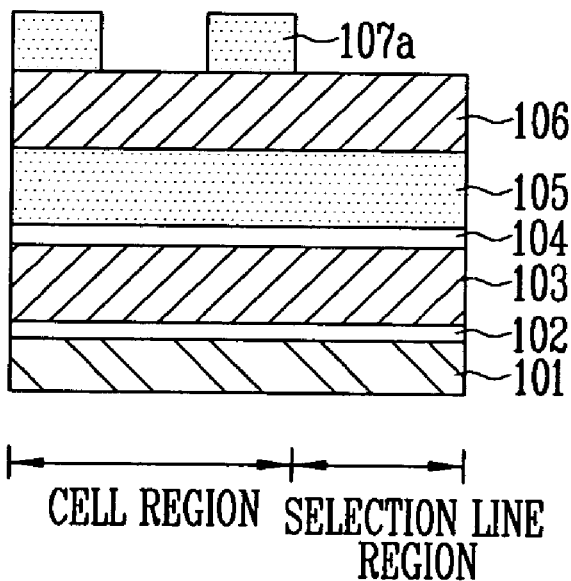

Referring to FIG. 2, the SiON layer 108 and the hard mask layer 107 are etched using the patterned photoresist 109 as a mask. The patterned photoresist 109 and the SiON layer 108 are removed, thereby forming a hard mask layer pattern 107a.

Figure 3:
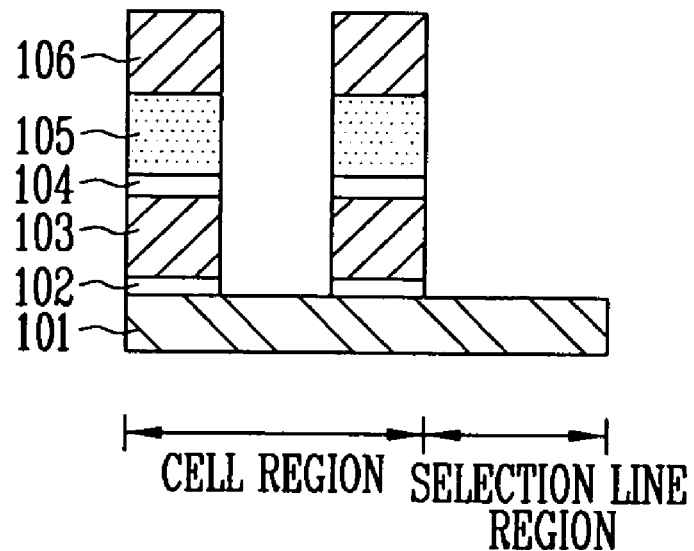

Referring to FIG. 3, the first nitride layer 106, the second polysilicon layer 105, the dielectric layer 104, the first polysilicon layer 103, and the tunnel oxide layer 102 are sequentially etched using the hard mask layer pattern 107a as a mask, and the hard mask layer pattern 107a is then stripped. Accordingly, a gate pattern is formed.

Figure 4:
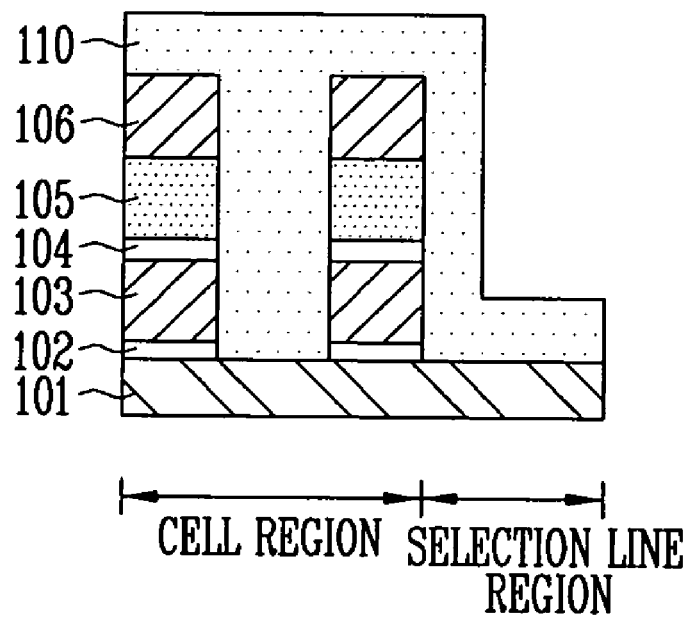

Referring to FIG. 4, after a cleaning process and an ion implantation process is performed on the result, an oxide layer 110 is formed on the entire surface. Accordingly, an oxide layer spacer is formed between the gates.

Figure 5:
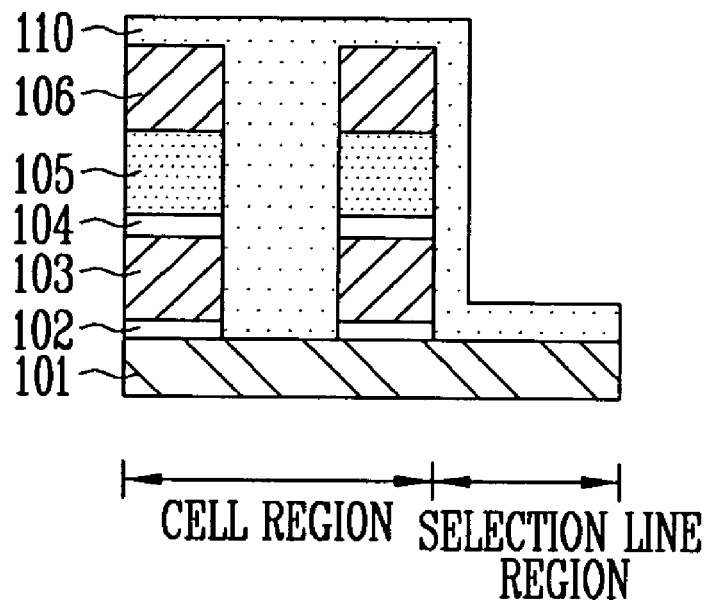

Referring to FIG. 5, the oxide layer 110 is formed to a desired thickness through an etch process. It is preferred that the oxide layer 110 be etched such that the height between the first nitride layer 106 and the oxide layer 110 is 200 Å to 500 Å.

Figure 6:
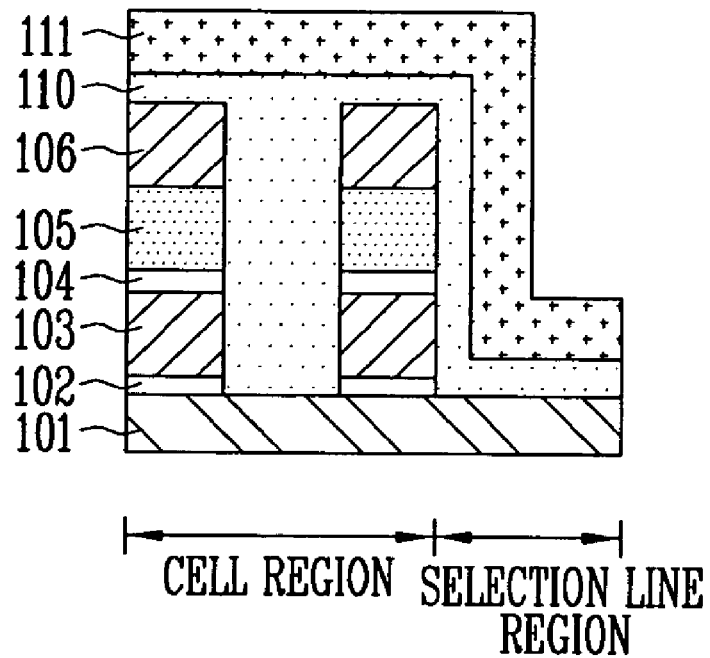

Referring to FIG. 6, a second nitride layer 111 is formed on the entire surface. It is preferred that the second nitride layer 111 be formed to a thickness of 300 Å to 1000 Å.

Figure 7:
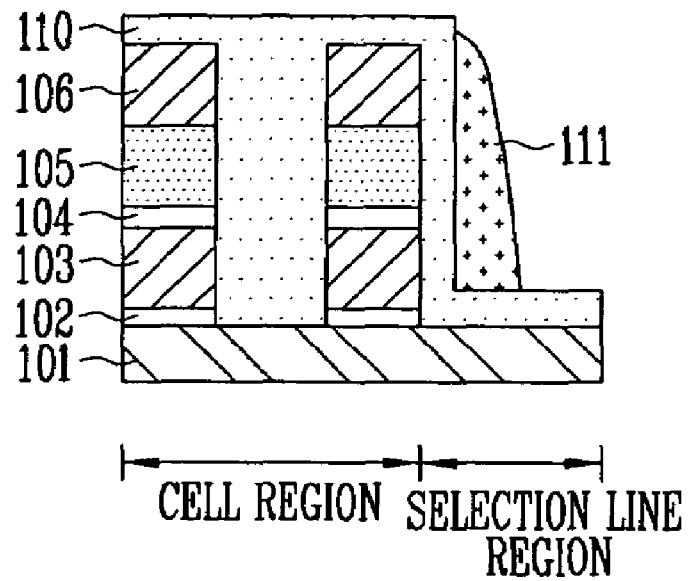

Referring to FIG. 7, if the second nitride layer 111 is etched, the second nitride layer 111 for a Self-Aligned Contact (SAC) remains on the sidewall of the oxide layer 110 of the selection line region in spacer form.

Figure 8:
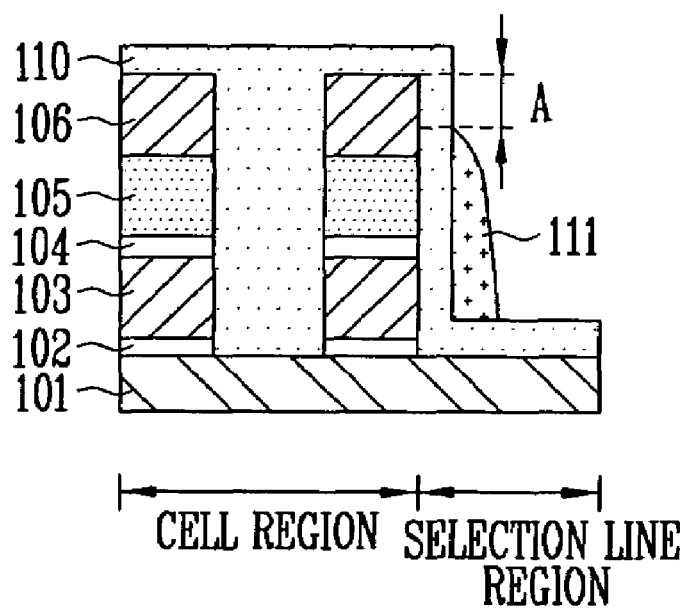

Referring to FIG. 8, if the second nitride layer 111 for the SAC remaining on the sidewall of the oxide layer 110 of the selection line region is located higher than the first nitride layer 106 of the gate pattern, there is a possibility that the second nitride layer 111 may be exposed in a subsequent etch process. Accordingly, the second nitride layer 111 is etched so that it is located lower than the first nitride layer 106. It is preferred that a height A between a top surface of the second nitride layer 111 and a top surface of the first nitride layer 106 be within a range of 200 Å to 500 Å.

Figure 9:
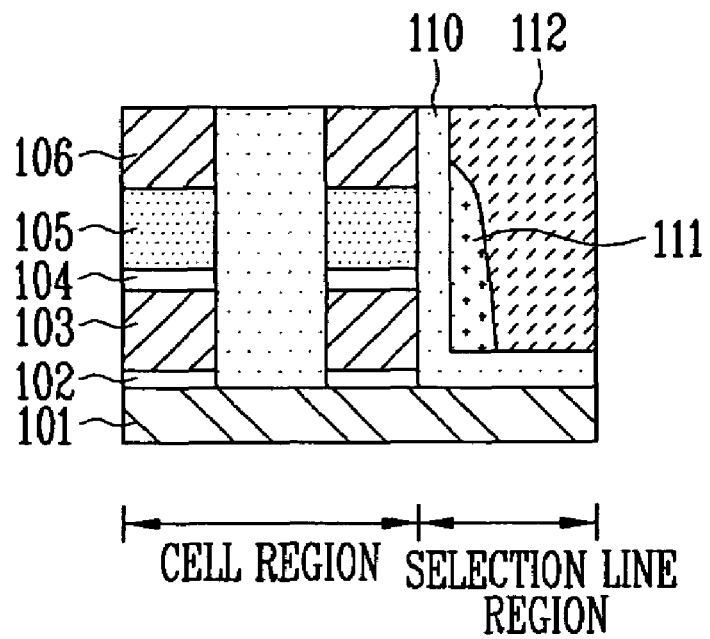

Referring to FIG. 9, an Inter-Layer Dielectric (ILD) 112 as an oxide layer is formed on the entire surface. After the ILD layer 112 is formed, Chemical Mechanical Polishing (CMP) is preferably performed on the resulting surface. At this time, the CMP process is performed until the first nitride layer 106 is exposed using the first nitride layer 106 as an etch-stop layer.

Figure 10:
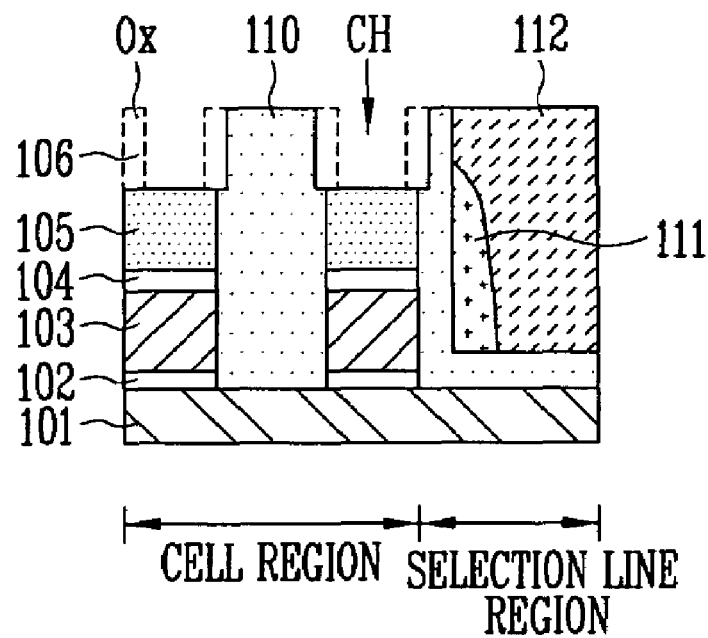

Referring to FIG. 10, the first nitride layer 106 is dipped out using a wet etch process. In this case, only the first nitride layer 106 is dipped out preferably using a phosphoric acid solution through the wet etch process. If an opening (CH) is formed by dipping out the first nitride layer 106, the Critical Dimension (CD) can be controlled by allowing the inside of the CH to remain or forming an oxide layer or a nitride layer on the sidewall of the CH as a spacer Ox. The spacer Ox is preferably formed to a thickness of 0 Å to 300 Å. (When the thickness of the spacer Ox is 0 Å, it means that the spacer Ox is not formed.)

Referring to FIG. 11, a barrier metal layer 113 is formed on the sidewall of the CH. Tungsten is deposited on the entire surface. The tungsten is polished using CMP until the barrier metal layer 113 is exposed, thereby forming a tungsten layer 114. The barrier metal layer 113 is preferably formed using any one of Ti and TiN, Ta and TaN, and WN. Aluminum (Al) or copper (Cu) may be used instead of the tungsten layer 114. A subsequent capping layer is formed, thereby completing the line process.

As described above, the method of forming the gate of the flash memory device according to the invention has the following advantages.

First, the tungsten layer is formed on the second polysilicon layer. Accordingly, gate pattern margin can be increased.

Second, a coupling ratio at the interface between the first and second polysilicon layers can be increased.

Third, the tungsten layer is not formed until the spacer is formed. Accordingly, subsequent thermal budget can be reduced.

Fourth, the resistance of the tungsten layer can be kept constant because α-carbon is used as the hard mask.

Fifth, since the SAC nitride layer is partially etched, the SAC nitride layer can be prevented from being opened.

Sixth, the CD between the gates can be controlled by forming the oxide layer or the nitride layer on the sidewall of the opening.

Seventh, capacitance between the gates can be controlled by lowering the height of the second polysilicon layer and the tungsten layer.

Eighth, etch process margin can be secured when forming the opening due to a reduction in the height of the gate.

Although the foregoing description has been made with reference to various embodiments, changes and modifications of the invention may be made by those of ordinary skill in the art without departing from the spirit and scope of the invention.

What is claimed is:

1. A method of forming a gate of a flash memory device, the method comprising:

forming a gate including a first nitride layer on a semiconductor substrate;

forming an oxide layer having a sidewall on the entire surface of the gate;

forming a second nitride layer on the sidewall of the oxide layer in a spacer form;

performing a polishing process so that a top surface of the first nitride layer is exposed;

stripping the first nitride layer to form an opening having a sidewall;

forming a barrier metal layer on the sidewall of the opening; and forming a tungsten layer in the opening.

2. The method of claim 1, wherein the forming of the gate comprises:

sequentially laminating a tunnel oxide layer, a first polysilicon layer, a dielectric layer, a second polysilicon layer, the first nitride layer, a hard mask layer, an SiON layer, and a photoresist on the semiconductor substrate;

patterning the photoresist;

etching the SiON layer and the hard mask layer using the patterned photoresist as a mask;

removing the patterned photoresist and the SiON layer, thereby forming a hard mask layer pattern;

etching the first nitride layer, the second polysilicon layer, the dielectric layer, the first polysilicon layer, and the tunnel oxide layer using the hard mask layer pattern as a mask; and stripping the hard mask layer pattern.

3. The method of claim 2, comprising forming the first nitride layer to a thickness of 500 Å to 2000 Å.

4. The method of claim 2, comprising forming the hard mask layer using α-carbon to a thickness of 500 Å to 2000 Å.

5. The method of claim 2, comprising forming the SiON layer to a thickness of 100 Å to 1000 Å.

6. The method of claim 1, wherein after the oxide layer is etched, a height between the second nitride layer and the oxide layer is 200 Å to 500 Å.

7. The method of claim 1, comprising forming the second nitride layer to a thickness of 300 Å to 1000 Å.

8. The method of claim 1, wherein a height between a top surface of the first nitride layer and a top surface of the second nitride layer is set within a range of 200 Å to 500 Å.

9. The method of claim 2, wherein a height between a top surface of the first nitride layer and a top surface of the second nitride layer is set within a range of 200 Å to 500 Å.

10. The method of claim 2, comprising performing a wet etch process using a phosphoric acid solution on the first nitride layer in order to form an opening.

11. The method of claim 1, comprising forming the barrier metal layer using one of W, Ti and TiN, Ta and TaN, and WN.

12. The method of claim 1, further comprising forming an oxide layer or a nitride layer on the sidewall of the opening before forming the barrier metal layer.

* * * * *